(12) United States Patent
Shafiyan-Rad et al.

(10) Patent No.: US 12,512,379 B2
(45) Date of Patent: Dec. 30, 2025

(54) LOW-PROFILE SEALED SURFACE-MOUNT PACKAGE

(71) Applicant: Microchip Technology Incorporated, Chandler, AZ (US)

(72) Inventors: Saeed Shafiyan-Rad, Nashua, NH (US); Evan Kirk, Salisbury, MA (US); David Doiron, Ashburnham, MA (US); Christopher Alan Barnes, Arvada, CO (US); Cliff Firth, Nashua, NH (US)

(73) Assignee: Microchip Technology Incorporated, Chandler, AZ (US)

( * ) Notice: Subject to any disclaimer, the term of this patent is extended or adjusted under 35 U.S.C. 154(b) by 621 days.

(21) Appl. No.: 17/882,987

(22) Filed: Aug. 8, 2022

(65) Prior Publication Data
US 2023/0360990 A1    Nov. 9, 2023

Related U.S. Application Data

(60) Provisional application No. 63/339,405, filed on May 6, 2022.

(51) Int. Cl.
*H01L 23/31*    (2006.01)
*H01L 23/29*    (2006.01)

(52) U.S. Cl.
CPC ........ *H01L 23/3142* (2013.01); *H01L 23/291* (2013.01); *H01L 23/296* (2013.01)

(58) Field of Classification Search
CPC . H01L 23/3142; H01L 23/291; H01L 23/296; H01L 23/10; H01L 23/15; H01L 23/49811; H01L 23/49844; H01L 23/055
See application file for complete search history.

(56) References Cited

U.S. PATENT DOCUMENTS

| | | | |
|---|---|---|---|
| 5,034,568 A | 7/1991 | Mather | 174/535 |
| 5,057,376 A | 10/1991 | Sunahara et al. | 428/432 |
| 5,569,958 A * | 10/1996 | Bloom | H01L 23/49883 174/265 |
| 5,750,926 A * | 5/1998 | Schulman | H01L 23/057 257/710 |
| 9,559,026 B2 | 1/2017 | Xiong et al. | |

(Continued)

FOREIGN PATENT DOCUMENTS

| | | | | |
|---|---|---|---|---|
| EP | 2657964 A2 | 10/2013 | ........... | H01L 23/055 |
| JP | 0368163 A | 3/1991 | ............. | H01L 23/50 |

OTHER PUBLICATIONS

International Search Report and Written Opinion, Application No. PCT/US2022/048773, 16 pages, Mar. 13, 2023.

*Primary Examiner* — Jeff W Natalini
*Assistant Examiner* — Nicholas Leland Hutson
(74) *Attorney, Agent, or Firm* — SLAYDEN GRUBERT BEARD PLLC (57) ABSTRACT

A hermetically sealed semiconductor die package having a sidewall structure having a first opening and a second opening; a lid attached to the sidewall structure to hermetically seal the first opening; a substrate attached to the sidewall structure to hermetically seal the second opening, wherein the substrate comprises first, second, and third apertures; a first button attached to the substrate to hermetically seal the first aperture; a second button attached to the substrate to hermetically seal the second aperture; and a third button attached to the substrate to hermetically seal the third aperture.

22 Claims, 6 Drawing Sheets

(56) References Cited

U.S. PATENT DOCUMENTS

| | | |
|---|---|---|
| 2010/0270669 A1 | 10/2010 | Medeiros, III et al. ...... 257/692 |
| 2016/0113138 A1* | 4/2016 | Au .......................... H05K 1/181 |
| | | 174/255 |
| 2016/0254203 A1* | 9/2016 | Xiong ................... H01L 23/373 |
| | | 257/690 |
| 2017/0025319 A1* | 1/2017 | Partington .............. H01L 24/00 |
| 2020/0006004 A1* | 1/2020 | Kojima .................. H01G 4/232 |
| 2023/0352360 A1* | 11/2023 | Martin ................ H01L 23/3732 |

* cited by examiner

FIG. 6

LOW-PROFILE SEALED SURFACE-MOUNT PACKAGE

RELATED APPLICATION

This application claims priority to commonly owned U.S. Provisional Patent Application No. 63/339,405 filed May 6, 2022, the entire contents of which are hereby incorporated by reference for all purposes.

TECHNICAL FIELD

The present disclosure relates to low-profile, sealed surface-mount packages for electronic power semiconductor devices, and more particularly to a hermetically sealed, mechanically robust, and thermally efficient surface-mount package structure for use in extreme temperature, power, and environmental conditions to provide improved power and thermal performance under extreme physical stress, such as space applications.

BACKGROUND

Power components (transistor, metal oxide semiconductor field effect transistors (MOSFET), and ETC) devices may be exposed to extreme environmental conditions. Certain applications, such as space program power components, specify high current capability and hermetic seals. MOSFET, diodes, and capacitors should be certified for the high temperatures (300° C.) needed to minimize heat rejection radiator mass that deep-space science and human exploration missions will encounter. Both scientific and human exploration missions employ radiation-hardened, extreme-temperature components and interconnects. Capabilities specified for NASA missions center on extreme-temperature, radiation-hardened, high-voltage (1,200 V) components. NASA's deep space missions use electric propulsion, wherein high-voltage manages current for high power electric thrusters. Electric propulsion applications employ a substantial increase (to >1,200 V) in voltage tolerance. There may be additional requirements to support rapid cycles of temperature and power supply levels, for example as specified in the JANS, JANTXV, JANTX and JAN product assurance levels.

Semiconductor packages suitable for use in environments such as space, are high current handling capability in the hundreds of amps, hermetic seals meeting JANS level specifications, low inductance, low impedance, high thermal conductivity, high flexibility in terms of heatsink capability, including multiple points of thermal conduction contacts, high isolation voltage capability for space applications (high altitude and near perfect vacuum environments), light weight relative to standard commercial copper based packages, capability to meet JANS space level HiRel screening and long term reliability testing, capability to support electronics in a high radiation/harsh environments, physical ruggedness to withstand harsh conditions experienced in launch vehicles, and scalability and dimensional flexibility to accommodate different electronic technology devices such as silicon, silicon carbide and gallium nitride, without limitation.

In the extreme environments of space applications, devices may also be radiation-hardened and hermetically sealed in a ceramic or metal case to prevent radiation from impacting operation of the device.

Power component devices in these extreme environments may experience extreme physical stress from the different coefficients of thermal expansion (CTE) of different materials. For example, stress may occur between the printed circuit board (PCB) and the hermetically sealed case, between the hermetically sealed case and the mounting substrates, and between the mounting substrates and the semiconductor die. Components mounted or attached to each other and made of different materials having different coefficients of thermal expansion may experience extreme physical stress when ambient temperatures change dramatically.

Notwithstanding extreme environment applications, size constraint design parameters may be relevant. Low profile MOSFET packages should satisfy size constraint design parameters.

There is a need for a low-profile, sealed surface-mount package that is mechanically robust and has improved power and thermal performance for use in extreme temperature, power, and environmental conditions that induce extreme physical stress.

SUMMARY

According to one aspect, there is provided a package having a sidewall structure having a first opening and a second opening; a lid attached to the sidewall structure to hermetically seal the first opening; a substrate attached to the sidewall structure to hermetically seal the second opening, wherein the substrate comprises first, second, and third apertures; a first button attached to the substrate to hermetically seal the first aperture; a second button attached to the substrate to hermetically seal the second aperture; and a third button attached to the substrate to hermetically seal the third aperture.

Another aspect provides a method comprising: attaching a drain for an electronic component to a first button; attaching a first lead to a second button; attaching a second lead to a third button; attaching the first, second and third buttons respectively to first, second and third apertures in a substrate; sealing the substrate to a first opening of a sidewall structure; and sealing a lid to a second opening of the sidewall structure.

According to another aspect, there is provided a system having a hermetically sealed package, the package comprising: a sidewall structure having a first opening and a second opening; a lid attached to the sidewall structure to hermetically seal the first opening; a substrate attached to the sidewall structure to hermetically seal the second opening, wherein the substrate comprises a first, a second, and a third aperture; a first button attached to the substrate to hermetically seal the first aperture; a second button attached to the substrate to hermetically seal the second aperture; and a third button attached to the substrate to hermetically seal the third aperture; a semiconductor die positioned in an interior of the hermetically sealed package; a first lead attached to the second button at an exterior of the hermetically sealed package; and a second lead attached to the third button at the exterior of the hermetically sealed package.

BRIEF DESCRIPTION OF THE FIGURES

The figures illustrate low-profile, sealed surface-mount packages with improved power and heat dissipation, and improved performance under extreme stress.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DESCRIPTION

Figure 1:
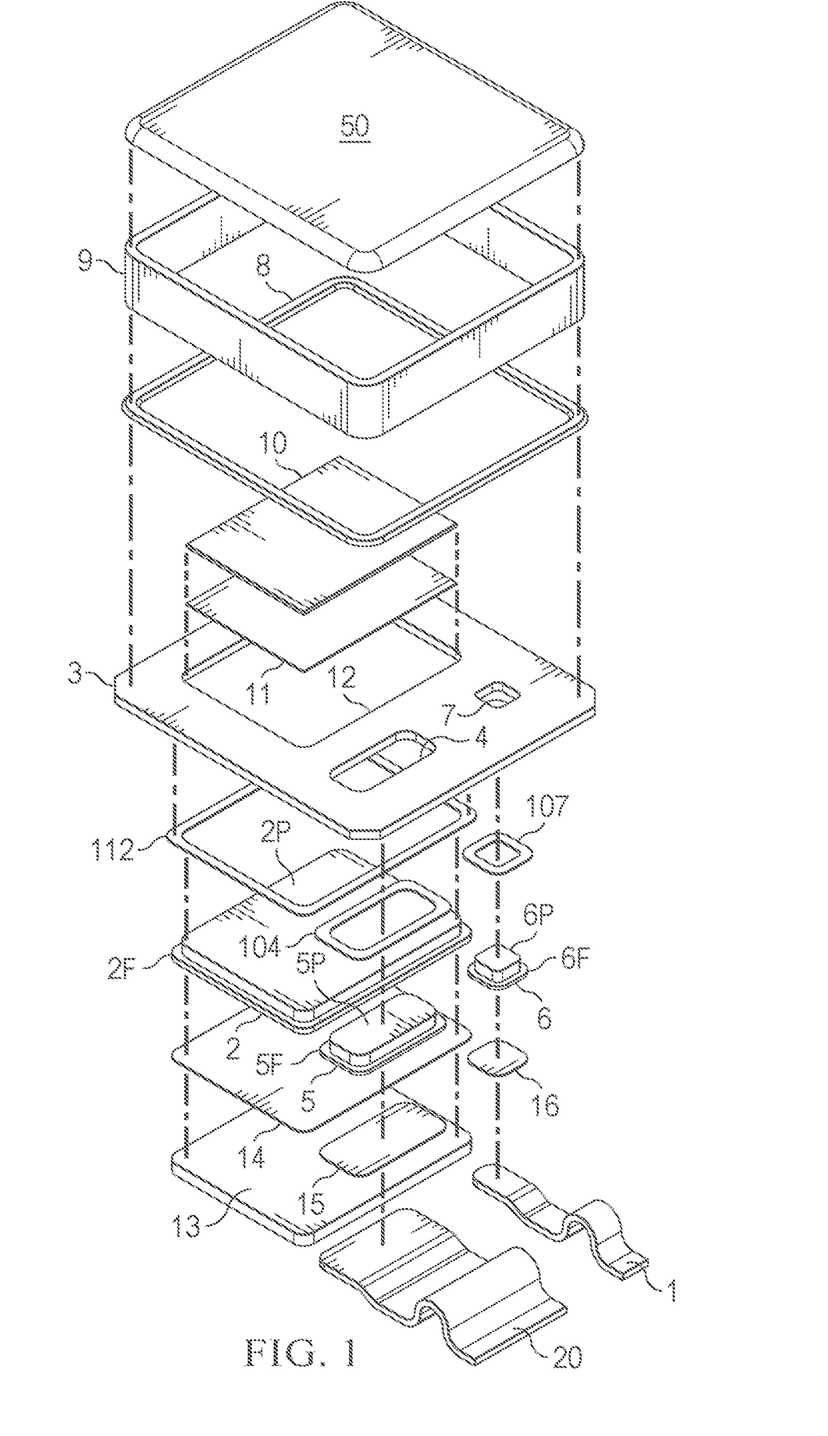
FIG. 1 shows an exploded perspective view of a low-profile, sealed surface-mount package.

FIG. 1 shows one of various examples of a low-profile, sealed surface-mount package. A hermetically sealed lid 50 may be attached to the top opening of sidewall structure 9 to create a hermetic seal. The process of attaching lid 50 to the top opening of sidewall structure 9 may include but is not limited to a soldering or brazing process, a tack-welding process, or application of an epoxy or other suitable adhesive material. Sidewall structure 9 may be a metal alloy, including but not limited to a nickel-cobalt ferrous alloy, or may be a ceramic material. A semiconductor die 10 may be positioned inside sidewall structure 9. Semiconductor die 10 may be a MOSFET device, a Gallium-Nitride device, a Gallium-Arsenide device or any other semiconductor device comprised of a semiconductor material. Semiconductor die 10 may function as a power transistor, a processor, or any other type of electronic function. Semiconductor die 10 may be attached to button 2 with a mounting layer 11 between a top face of button 2 and a bottom face of semiconductor die 10. Mounting layer 11 may provide a thermal and electrical connection between semiconductor die 10 and button 2. Mounting layer 11 may be comprised of a solder filler metal and may join semiconductor die 10 and button 2 using a solder reflow process. In various examples, mounting layer 11 may be comprised of a brazing filler metal and may join semiconductor die 10 and button 2 using a brazing process. Button 2 may be comprised of a Tungsten-copper alloy, or of any other material capable to thermally and electrically couple button 2 to mounting layer 11.

This surface mound device (SMD) package could be directly mounted to the PCB. The package may use a carrier in order to mount to the PCB.

Button 2 may be a flanged plug structure as shown in FIG. 1, wherein button 2 has a flange 2F and a plug 2P. Plug 2P of the button 2 has a geometric shape corresponding to the aperture 12 in the substrate 3 and is slightly smaller than the aperture 12 so that plug 2P may be inserted into aperture 12. Flange 2F is larger than plug 2P and aperture 12 so that flange 2F abuts the bottom side of substrate 3 when the plug 2P is inserted in aperture 12. Button 2 may be mounted in an aperture 12 in a substrate 3 using mounting layer 112, wherein the mounting layer 112 is positioned between the flange 2F and the substrate 3. Button 2 may be attached to aperture 12 using mounting layer 112 via a brazing process, a soldering process, or another process for attaching button 2 to aperture 12.

A bottom face of button 2 may be attached to a top face of drain contact 13 with a mounting layer 14 between. Drain contact 13 may be comprised of oxygen-free high conductivity copper or a copper alloy, or any other material capable to thermally and electrically couple a mounting layer 14 between the top face of drain contact 13 and the bottom face of button 2. Button 2 may be comprised of a Tungsten-copper alloy, or of any other material capable to thermally and electrically couple button 2 to mounting layer 14. Mounting layer 14 may be comprised of a braze filler metal, including but not limited to alloys comprised of Aluminum-Silicon, Copper-Phosphorus, Silver, Copper, Copper-Zinc, Magnesium, Nickel, or Cobalt.

A button 6 may be a flanged plug structure as shown in FIG. 1, wherein button 6 has a flange 6F and a plug 6P. Plug 6P of the button 6 has a geometric shape corresponding to the aperture 7 in the substrate 3 and is slightly smaller than the aperture 7 so that plug 6P may be inserted into aperture 7. Flange 6F is larger than plug 6P and aperture 7 so that flange 6F abuts the bottom side of substrate 3 when the plug 6P is inserted in aperture 7. Button 6 may be mounted in aperture 7 in substrate 3 using mounting layer 107, wherein the mounting layer 107 is positioned between the flange 6F and the substrate 3. Button 6 may be attached to aperture 7 using mounting layer 107 via a brazing process, a soldering process, or another process for attaching button 6 to aperture 7. A bottom face of button 6 may be attached to a top face of a portion of lead structure 1 with mounting layer 16 between. Lead structure 1 may be comprised of oxygen free high conductivity copper or a copper alloy, or any other material capable to thermally and electrically couple to mounting layer 16. Button 6 may be comprised of a Tungsten-copper alloy, or of any other material capable to thermally and electrically couple button 6 to mounting layer 16. Mounting layer 16 may be comprised of a braze filler metal, including but not limited to alloys comprised of Aluminum-Silicon, Copper-Phosphorus, Silver, Copper, Copper-Zinc, Magnesium, Nickel, or Cobalt.

A button 5 may be a flanged plug structure as shown in FIG. 1, wherein button 5 has a flange 5F and a plug 5P. Plug 5P of the button 5 has a geometric shape corresponding to the aperture 4 in the substrate 3 and is slightly smaller than the aperture 4 so that plug 5P may be inserted into aperture 4. Flange 5F is larger than plug 5P and aperture 4 so that flange 5F abuts the bottom side of substrate 3 when the plug 5P is inserted in aperture 4. Button 5 may be mounted into an aperture 4 in substrate 3 using mounting layer 104, wherein the mounting layer 104 is positioned between the flange 5F and the substrate 3. Button 5 may be attached to aperture 4 using mounting layer 104 via a brazing process, a soldering process, or another process for attaching button 5 to aperture 4. A bottom face of button 5 may be attached to a top face of a portion of lead structure 20 using a mounting layer 15 between. Lead structure 20 may be comprised of oxygen-free high conductivity copper or a copper alloy, or any other material capable to thermally and electrically couple to mounting layer 15. Button 5 may be comprised of a Tungsten-copper alloy, or of any other material capable to thermally and electrically couple button 5 to mounting layer 15. Mounting layer 15 may be a braze filler metal, including but not limited to alloys comprised of Aluminum-Silicon, Copper-Phosphorus, Silver, Copper, Copper-Zinc, Magnesium, Nickel, or Cobalt.

Substrate 3 may be comprised of a Zirconium Oxide insulating material. Substrate 3 may be comprised of Silicon Nitride ceramic or of other materials not listed here which may provide thermal and electrical insulation between the plurality of button structures. The example of FIG. 1 includes three apertures, but various examples of substrate 3 may include more apertures than the number of apertures shown in FIG. 1 or may include fewer apertures than the number of apertures shown in FIG. 1.

Drain contact 13, lead structure 1 and lead structure 20 may provide multiple points of contact from the package to a PCB substrate, enabling efficient transfer of heat away from the package and improving overall thermal conductivity.

A mounting layer 8 may be comprised of a braze filler metal. Mounting layer 8 may be used in a brazing process to braze substrate 3 to a bottom of sidewall structure 9 to create a hermetic seal. Mounting layers 14, 15, and 16 may be respectively comprised of solder filler metals, and may thermally and electrically couple, respectively, button 2 to drain contact 13, button 6 to lead structure 1, and button 5 to lead structure 20, using a soldering technique. Mounting layers 14, 15, and 16 may alternatively be respectively comprised of braze filler metals, and may thermally and electrically couple, respectively, button 2 to drain contact 13, button 6 to lead structure 1, and button 5 to lead structure 20, using a brazing technique.

The structure of FIG. 1 may form a low-profile, sealed surface-mount package.

In operation, the low-profile, sealed surface-mount package of FIG. 1 may expand as heat increases, and contract as heat decreases. Different materials of the package may have different values of Coefficient of Thermal Expansion (CTE). The composition of materials in the package of various examples may provide for a gradual change in CTE across the different components of the package and reduce the stress caused by thermal expansion and contraction.

Figure 2:
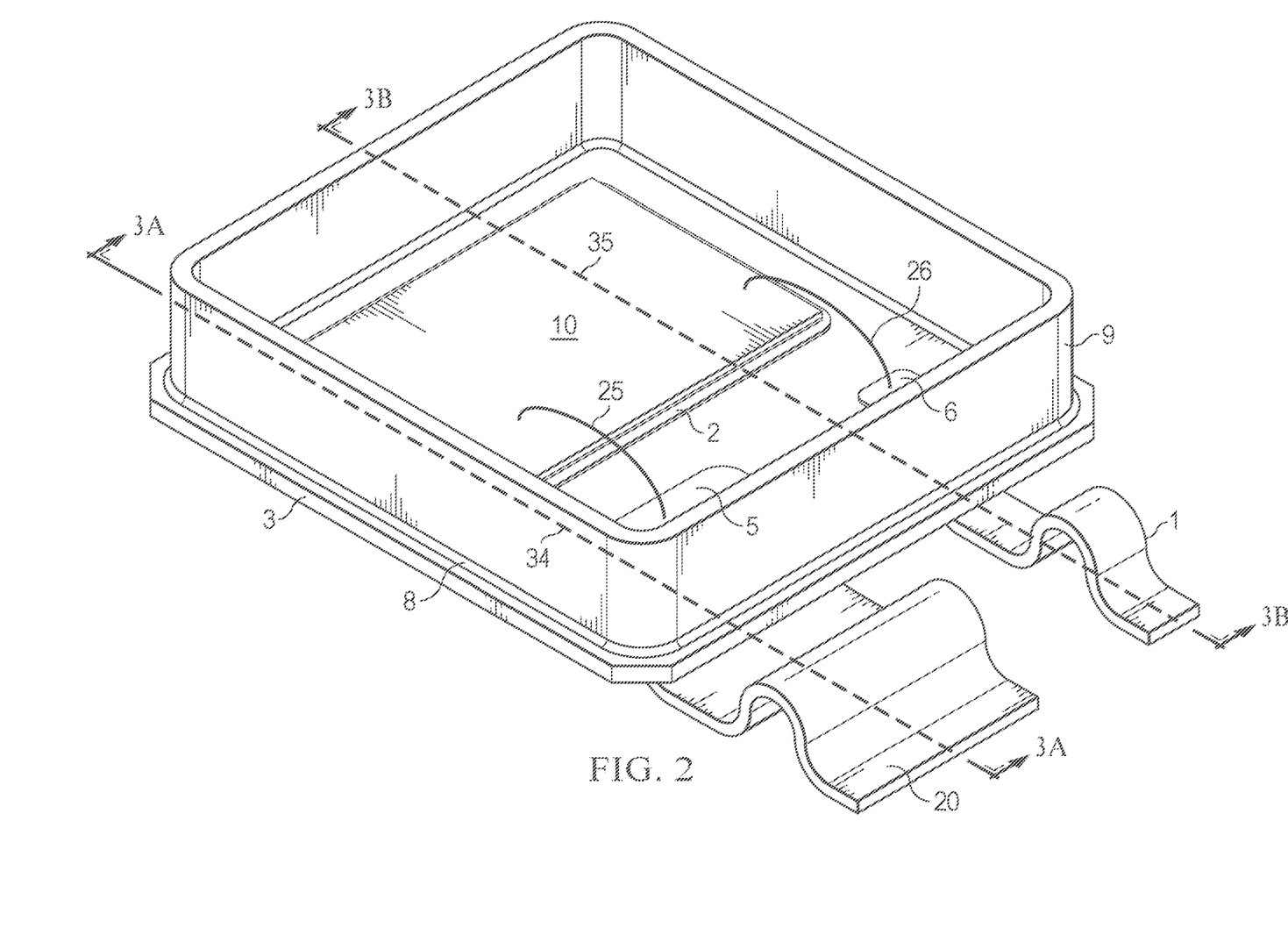
FIG. 2 shows a perspective top view of a low-profile, sealed surface-mount package, with an MOSFET mounted therein.

FIG. 2 shows a perspective side view of the low-profile, sealed surface-mount package. FIG. 2 is shown with the package lid removed for more easy viewing. Semiconductor die 10 may be coupled to button 2 with a mounting later 11 (not shown). Button 2 may be a conductive material to thermally and electrically couple to the semiconductor die 10 through mounting layer 11. Button 2 may be comprised of a Tungsten-copper alloy, or of any other material capable to thermally and electrically couple button 2 mounting layer 11.

Button 5 may be a conductive material coupled to lead 20 with mounting layer 15 (not shown) between. Button 5 may be comprised of a Tungsten-copper alloy, or of any other material capable to thermally and electrically couple to the mounting layer 15. A bond wire 25 may electrically couple button 5 to semiconductor die 10. The example of FIG. 2 shows a single bond wire 25, but in various examples more than one bond wire may electrically couple button 5 to semiconductor die 10.

Button 6 may be a conductive material coupled to lead 1 with mounting layer 16 (not shown) between. Button 6 may be comprised of a Tungsten-copper alloy, or of any other material capable to thermally and electrically couple lead structure 1 to mounting layer 16. A bond wire 26 may electrically couple button 6 to semiconductor die 10. The example of FIG. 2 shows a single bond wire 26, but in various examples more than one bond wire may electrically couple button 6 to semiconductor die 10.

In various examples, lead structure 1 may be electrically coupled to a gate terminal of a MOSFET device on semiconductor die 10 via wire bond 26, lead structure 20 may be electrically coupled to a source terminal of a transistor device on semiconductor die 10 via wire bond 25 to connect the source from the MOSFET to button 5.

Figure 3A:
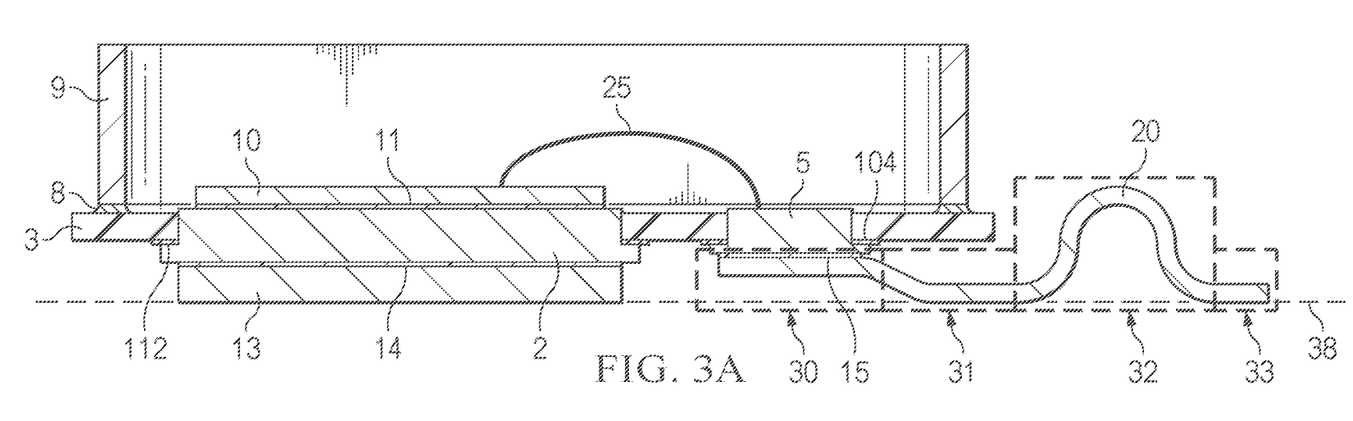
FIG. 3A shows a cross-sectional side view of a low-profile, sealed surface-mount package along line 3A-3A shown in FIG. 2.

FIG. 3A shows one of various examples of the low-profile, sealed surface-mount package from a side cross-section view. The cross-section view is drawn along the axis marked 3A-3A in FIG. 2. Button 2 may be a conductive material thermally and electrically coupled to semiconductor die 10 with mounting layer 11 between. Button 5 may be a conductive material coupled to lead 20 with mounting layer 15 between. Lead 20 may extend laterally from mounting section 30 to first base section 31, then curved section 32 and terminating in base section 33. The top face of mounting section 30 may be electrically and thermally coupled to mounting layer 15, as described above. Button 2 may be comprised of a Tungsten-copper alloy, or of any other material capable to thermally and electrically couple drain contact 13 to mounting layer 14. Button 5 may be comprised of a Tungsten-copper alloy, or of any other material capable to thermally and electrically couple button 5 to mounting layer 15. Drain contact 13 may be comprised of oxygen-free high conductivity copper or a copper alloy, or any other material capable to thermally and electrically couple drain contact 13 to mounting layer 14.

Lead 20 may comprise a mounting section 30, a first base section 31, a curved section 32, and a second base section 33. Identification of mounting section 30, a first base section 31, a curved section 32 and a second base section 33 is for descriptive purposes and is not intended to limit the structure or composition of lead 20. In various examples, mounting section 30, first base section 31, curved section 32 and second base section 33 may be a single piece of material of one composition, extending laterally from mounting section 30 to first base section 31, then curved section 32 and terminating in second base section 33. The top face of mounting section 30 may be electrically and thermally coupled to mounting layer 15, as described above. In various examples, curved section 32 may rise above a baseline 38 to a higher elevation above first base section 31 and second base section 33 than the elevation shown in FIG. 3A. In various examples, curved section 32 may rise above baseline 38 to a lower elevation above first base section 31 and second base section 33 than the elevation shown in FIG. 3A. Curved section 32 may improve the stress tolerance of the package. Curved section 32 may provide additional stress relief and allows the leads to deform in a favorable location and absorb stress.

Bond wire 25 may couple button 5 to semiconductor die 10. The example of FIG. 3A shows a single bond wire 25, but in various examples more than one bond wire may couple button 5 to semiconductor die 10.

Figure 3B:
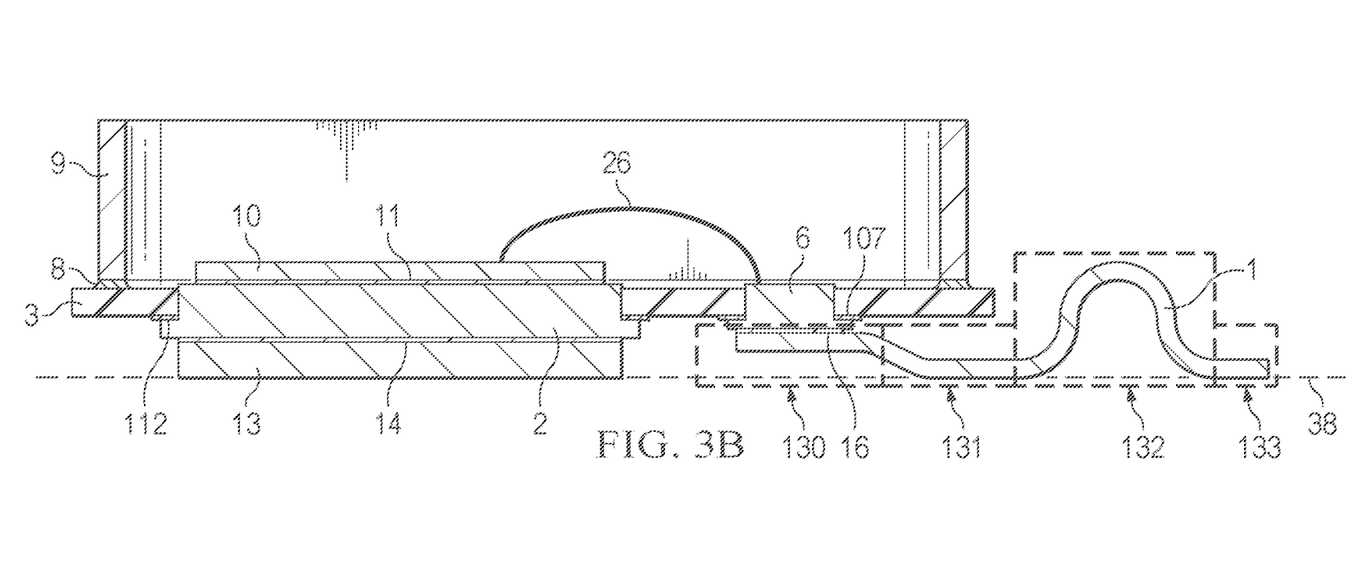
FIG. 3B shows a cross-sectional side view of a low-profile, sealed surface-mount package along line 3B-3B shown in FIG. 2.

FIG. 3B shows one of various examples of the low-profile, sealed surface-mount package from a side cross-section view. The cross-section view is drawn along the axis marked 3B-3B in FIG. 2. Button 2 may be a conductive material thermally and electrically coupled to semiconductor die 10 with mounting layer 11 between. Button 6 may be a conductive material coupled to lead 1 with mounting layer 16 between. Lead 1 may extend laterally from mounting section 130 to first base section 131, then curved section 132 and terminating in base section 133. The top face of mounting section 130 may be electrically and thermally coupled to mounting layer 16 as described above. Button 2 may be comprised of a Tungsten-copper alloy, or of any other material capable to thermally and electrically couple to mounting layer 11. Button 6 may be comprised of a Tungsten-copper alloy, or of any other material capable to thermally and electrically couple button 6 to mounting layer 16. Drain contact 13 may be comprised of oxygen-free high conductivity copper or a copper alloy, or any other material capable to thermally and electrically couple drain contact 13 to mounting layer 14.

Lead 1 may comprise a mounting section 130, a first base section 131, a curved section 132, and a second base section 133. Identification of mounting section 130, first base section 131, curved section 132 and second base section 133 if for descriptive purposes and is not intended to limit the structure or composition of lead 1. In various examples, mounting section 130, first base section 131, curved section 132 and second base section 133 may be a single piece of material of one composition. In various examples, curved section 132 may rise above baseline 38 to a higher elevation above first base section 131 and second base section 133 than the elevation shown in FIG. 3B. In various examples, curved section 132 may rise above baseline 38 to a lower elevation above first base section 131 and second base section 133 than the elevation shown in FIG. 3B. Curved section 132 may improve the stress tolerance of the package. Curved section 132 may provide additional stress relief and allows the leads to deform in a favorable location and absorb stress.

Bond wire 26 may couple button 6 to semiconductor die 10. The example of FIG. 3B shows a single bond wire 26, but in various examples more than one bond wire may couple button 6 to semiconductor die 10.

Figure 4:
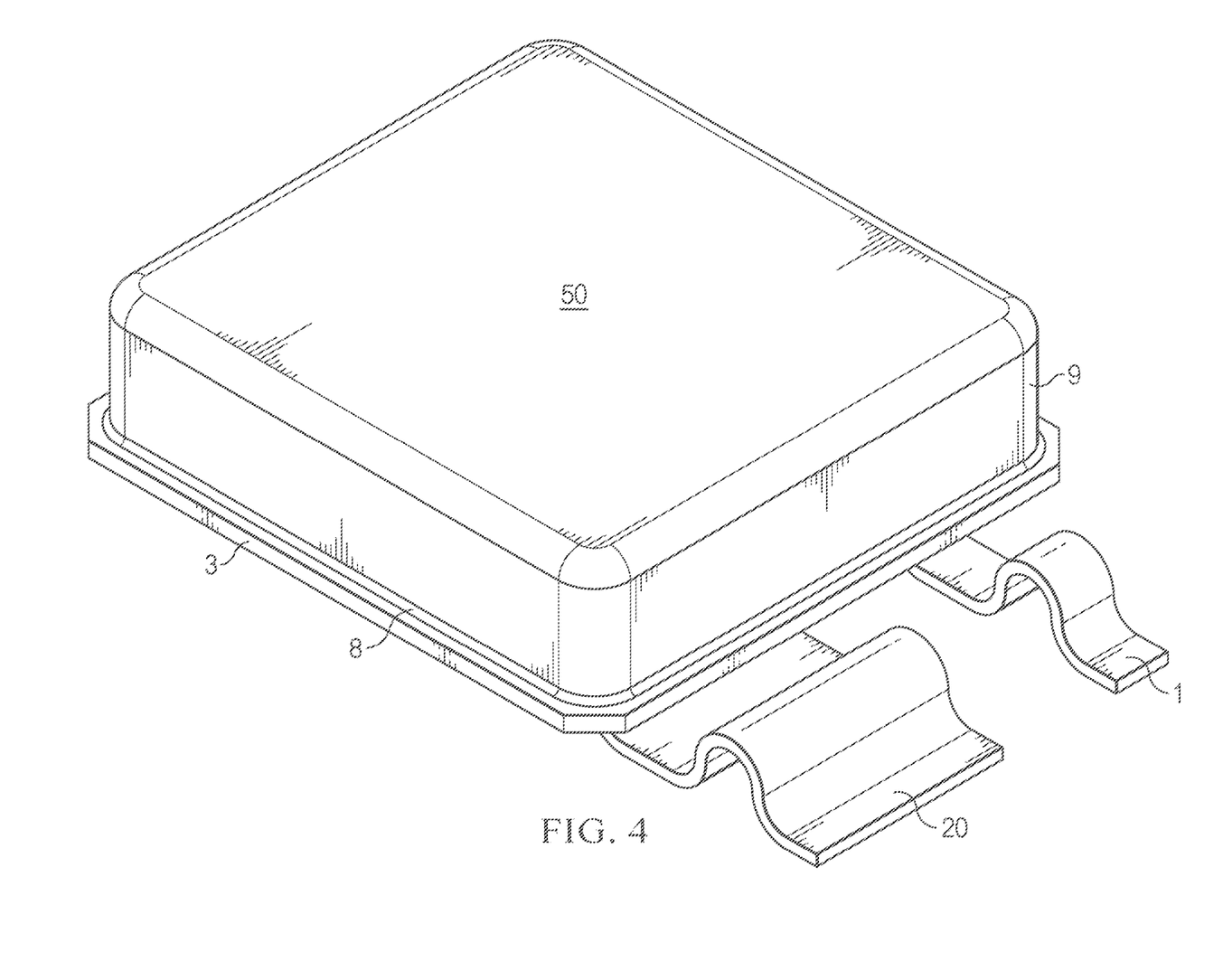
FIG. 4 shows a perspective top view of a low-profile, sealed surface-mount package with a lid attached.

FIG. 4 shows one of various examples of the package, including lid 50. Lid 50 may be attached to a top opening of sidewall structure 9 to form a hermetic seal. Mounting layer 8 may form a hermetic seal between substrate 3 and a bottom opening of sidewall structure 9. The square cubic package shape shown in FIG. 4 is not intended to limit other package shapes. A package may be a rectangular cubic structure, a cylindrical structure, or another shape not specified explicitly.

Figure 5:
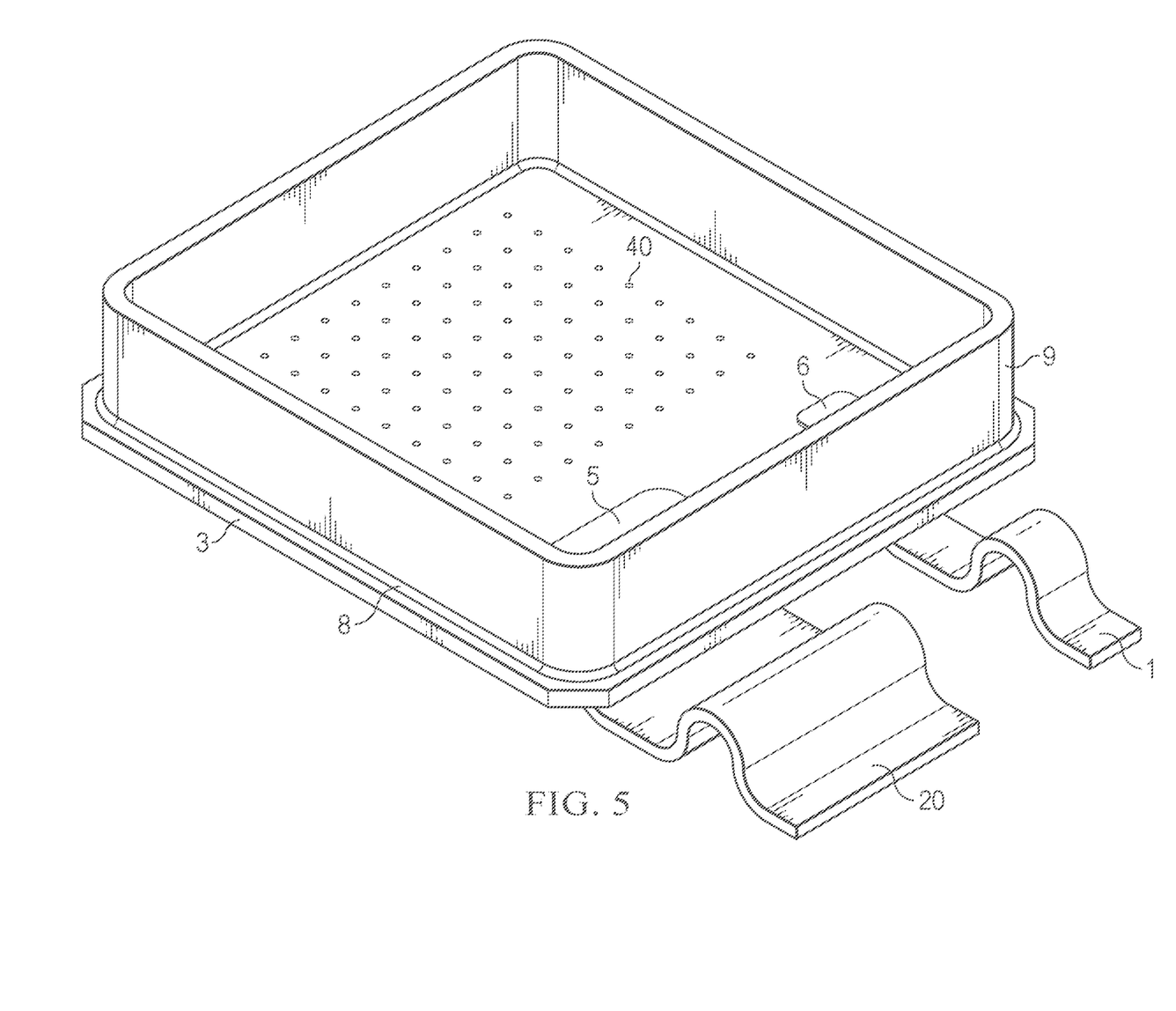
FIG. 5 shows a low-profile, sealed surface-mount package with vias from an overhead perspective view.

FIG. 5 shows one example of a package from an overhead perspective view. The package lid has been removed for easier viewing. A bottom opening of sidewall structure 9 may be attached to substrate 3 via mounting layer 8. Button 6 may be thermally and electrically coupled to lead 1. Button 5 may be thermally and electrically coupled to lead 20. For purposes of this description, the term button refers to a conductive structure not limited to a round shape. The shape of a button may include but is not limited to a circle, oval, ellipse, square, rectangle or other shape not specifically mentioned. A plurality of vias 40 may provide electrical connection through the substrate to a drain structure (not shown). These Vias may provide the interconnect between the internal and external drain structure on the hermetic package.

In operation, a semiconductor die may be mounted on the inside of the package and vias ~40 may provide electrical and thermal connection from the semiconductor die to the exterior of the package.

This design may utilize ceramics with higher thermal conductivity and increased strength/toughness compared to other ceramics to allow functionality in a smaller size package.

Figure 6:
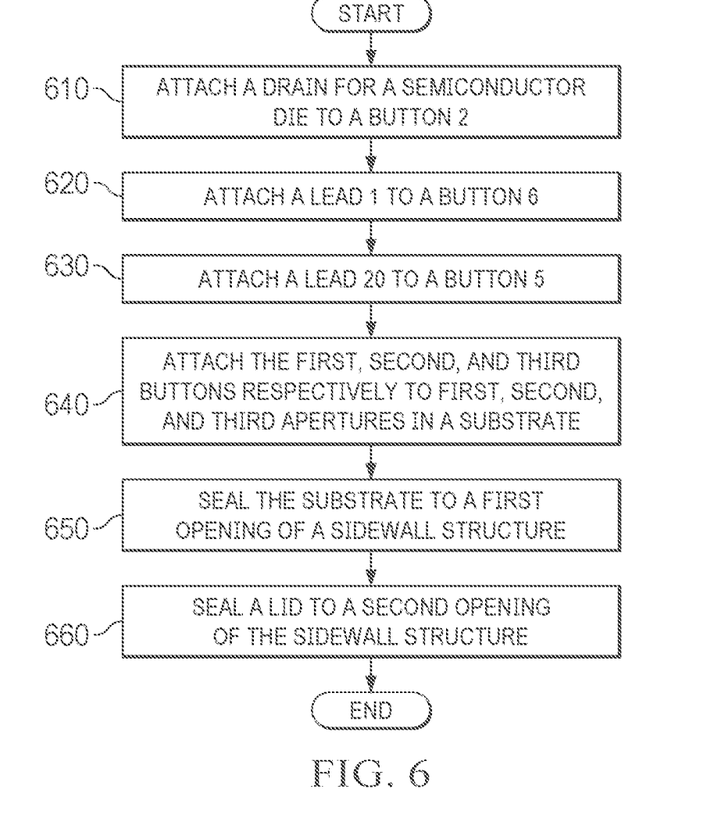
FIG. 6 shows a flow chart for a method for making a low-profile, sealed surface-mount package.

FIG. 6 illustrates a flow chart of a method for making a hermetically sealed semiconductor die package. A method comprises attaching 610 a drain 13 (see FIG. 2) for a semiconductor die 10to a button 2; attaching 620 a lead structure 1 to a button 6; attaching 630 a lead structure 20 to a button 5; attaching 640 the buttons 2, 6 and 5 respectively to apertures 12, 7, and 4 in a substrate 3; sealing 650 the substrate 3 to a first opening of a sidewall structure 9; sealing 660 a lid 50 to a second opening of the sidewall structure 9. First, the drain 13 for a semiconductor die 10 may be attached 610 to button 2 by a mounting layer 14. See FIG. 2. Second, button 6 may be attached 620 to lead structure 1 with mounting layer 16 between. Third, button 5 may be attached 630 to lead structure 20 using mounting layer 15 between. Fourth, drain 13, button 2, and button 6 may be attached 640 to aperture 12, aperture 4, and aperture 7 respectively using a brazing process, a soldering process, or another process for attaching the drain and buttons to apertures in the substrate 3. Fifth, the substrate 3 may be sealed 650 in the bottom opening of the sidewall structure 9. This may be a hermetic seal. Sixth, a lid 50 may be sealed 660 to the top of sidewall structure 9 to create a hermetic seal.

The invention claimed is:

1. A package comprising:
   a sidewall structure having a first opening and a second opening;
   a lid attached to the top of the sidewall structure to hermetically seal the first opening;
   a substrate attached to the bottom of the sidewall structure to hermetically seal the second opening, wherein the substrate comprises first, second, and third apertures;
   a first button attached to the substrate to hermetically seal the first aperture;
   a second button attached to the substrate to hermetically seal the second aperture; and
   a third button attached to the substrate to hermetically seal the third aperture, wherein first and second leads respectively comprise a mounting section formed with a first base section, the first base section formed with a curved section, the curved section formed with a second base section, wherein the first base section and the second base section are at a common lateral height.

2. The package as claimed in claim 1, wherein the sidewall structure comprises a nickel-cobalt ferrous alloy.

3. The package as claimed in claim 1, wherein the lid is attached to the sidewall structure via a brazed connection to thereby hermetically seal the first opening.

4. The package as claimed in claim 1, wherein the substrate comprises silicon nitride ceramic.

5. The package as claimed in claim 1, wherein the substrate comprises zirconium oxide.

6. The package as claimed in claim 1, wherein the substrate is attached to the sidewall structure via a brazed connection to thereby hermetically seal the second opening.

7. The package as claimed in claim 1, wherein the first, second and third buttons are attached to the substrate via a respective brazed connection.

8. The package as claimed in claim 1, wherein the first, second and third buttons comprise a copper tungsten alloy.

9. The package as claimed in claim 1, comprising a drain attached to the first button.

10. The package as claimed in claim 9, wherein the drain is comprised of an oxygen-free high thermal conductivity copper or an oxygen-free high thermal conductivity copper alloy.

11. The package as claimed in claim 1, comprising a first lead attached to the second button and a second lead attached to the third button.

12. The package as claimed in claim 11, wherein the first and second leads comprise an oxygen-free high thermal conductivity copper or oxygen-free high thermal conductivity copper alloy.

13. A method comprising:
attaching a drain for an electronic component to a first button;
attaching a first lead to a second button;
attaching a second lead to a third button;
attaching the first, second and third buttons respectively to first, second and third apertures in a substrate;
sealing the substrate to a first opening of a sidewall structure; and
sealing a lid to a second opening of the sidewall structure, wherein attaching the first lead to the second button comprises brazing the first lead to the second button using a braze filler metal and attaching the second lead to the third button comprises brazing the second lead to the third button using the braze filler metal, wherein first and second leads respectively comprise a mounting section formed with a first base section, the first base section formed with a curved section, the curved section formed with a second base section, wherein the first base section and the second base section are at a common lateral height.

14. A method as claimed in claim 13, wherein attaching the drain for the electronic component to the first button comprises brazing the drain for the electronic component to the first button using a braze filler metal.

15. A method as claimed in claim 13, wherein attaching the first, second and third buttons respectively to first, second and third apertures of the substrate comprises brazing the first, second and third buttons respectively to the first, second and third apertures in the substrate using a braze filler metal.

16. A method as claimed in claim 13, wherein sealing the substrate to the first opening of the sidewall structure comprises brazing the sidewall structure to the substrate using a braze filler metal.

17. A method as claimed in claim 13, wherein the sealing the lid to the second opening of the sidewall structure comprises brazing the lid to the second opening of the sidewall structure using a braze filler metal.

18. A system comprising:
a hermetically sealed package comprising:
  a sidewall structure having a first opening and a second opening;
  a lid attached to the sidewall structure to hermetically seal the first opening;
  a substrate attached to the sidewall structure to hermetically seal the second opening, wherein the substrate comprises a first, a second, and a third aperture;
  a first button attached to the substrate to hermetically seal the first aperture;
  a second button attached to the substrate to hermetically seal the second aperture; and
  a third button attached to the substrate to hermetically seal the third aperture;
a semiconductor die positioned in an interior of the hermetically sealed package;
a first lead attached to the second button at an exterior of the hermetically sealed package; and
a second lead attached to the third button at the exterior of the hermetically sealed package, wherein the first lead comprises a respective mounting section formed with a respective first base section, the first base section of the first lead formed with a respective curved section, the curved section of the first lead formed with a respective second base section, and wherein the second lead comprises a respective mounting section formed with a first base section, the first base section formed with a curved section, the curved section formed with a second base section, wherein the first base section and the second base section are at a common lateral height.

19. The system as claimed in claim 18, comprising a first wire bond coupled between the second button and the semiconductor die at the interior of the hermetically sealed package; and a second wire bond coupled between the third button and the semiconductor die at the interior of the hermetically sealed package.

20. The package as claimed in claim 1, wherein the mounting section, the first base section, the curved section, and the second base section comprise a single piece of material of one composition and extend laterally from the mounting section to the first base section then the curved section and terminating in the second base section, wherein the curved section rises above the first base section and second base section.

21. The method as claimed in claim 13, wherein the mounting section, the first base section, the curved section, and the second base section comprise a single piece of material of one composition and extend laterally from the mounting section to the first base section then the curved section and terminating in the second base section, wherein the curved section rises above the first base section and second base section.

22. The system as claimed in claim 18, wherein the mounting section, the first base section, the curved section, and the second base section comprise a single piece of material of one composition and extend laterally from the mounting section to the first base section then the curved section and terminating in the second base section, wherein the curved section rises above the first base section and second base section.

* * * * *